(12) United States Patent
Groninger

(10) Patent No.: US 8,091,217 B2
(45) Date of Patent: Jan. 10, 2012

(54) CONTACT ELEMENT, CONTACT UNIT, METHOD FOR PRODUCING A CONTACT UNIT, AND METHOD FOR PLACING INTO OPERATION FOR FINE-PITCH PARTS

(75) Inventor: Horst Groninger, Maxhutte (DE)

(73) Assignee: Infineon Technologies AG, Munich (DE)

( * ) Notice: Subject to any disclaimer, the term of this patent is extended or adjusted under 35 U.S.C. 154(b) by 207 days.

(21) Appl. No.: 12/533,540

(22) Filed: Jul. 31, 2009

(65) Prior Publication Data

US 2009/0307904 A1  Dec. 17, 2009

Related U.S. Application Data

(62) Division of application No. 11/677,264, filed on Feb. 21, 2007, now abandoned.

(51) Int. Cl.
*H01R 43/00* (2006.01)

(52) U.S. Cl. ............ 29/827; 29/844; 29/845; 29/874; 29/884; 29/623

(58) Field of Classification Search .......... 29/844, 29/827, 874, 882, 884, 832, 853, 623, 845; 324/754, 757, 758, 761; 257/551; 439/66, 439/71, 80–83, 68–70
See application file for complete search history.

(56) References Cited

U.S. PATENT DOCUMENTS

| | | | |
|---|---|---|---|
| 3,670,409 A | 6/1972 | Reimer | |
| 3,853,382 A | 12/1974 | Lazar | |
| 5,152,695 A * | 10/1992 | Grabbe et al. | 439/71 |
| 5,173,055 A * | 12/1992 | Grabbe | 439/66 |
| 5,800,184 A | 9/1998 | Lopergolo et al. | |
| 6,179,624 B1 * | 1/2001 | McHugh et al. | 439/71 |
| 6,305,993 B1 | 10/2001 | Heimueller | |
| 6,860,766 B2 | 3/2005 | Aujla et al. | |
| 6,911,130 B2 | 6/2005 | Brenneman et al. | |
| 6,965,245 B2 * | 11/2005 | Kister et al. | 324/754.07 |

FOREIGN PATENT DOCUMENTS

DE  19945178  8/2001

* cited by examiner

*Primary Examiner* — Derris Banks
*Assistant Examiner* — Tai Nguyen
(74) *Attorney, Agent, or Firm* — Banner & Witcoff, Ltd.

(57) ABSTRACT

A contact element for producing an electric contact has a laser cut conducting plate, with the contour of the laser cut conducting plate including at least two tips, which are embodied as contact tips for a contact pad of a part, connected to each other by a separating area, such that a one-piece semi-finished part is embodied.

8 Claims, 4 Drawing Sheets

CONTACT ELEMENT, CONTACT UNIT, METHOD FOR PRODUCING A CONTACT UNIT, AND METHOD FOR PLACING INTO OPERATION FOR FINE-PITCH PARTS

RELATED APPLICATIONS

This application is a divisional of U.S. patent application Ser. No. 11/677,264 filed Feb. 21, 2007, which claims priority from German Patent Application No. DE 10 2007 006 195.3, which was filed on Feb. 7, 2007, and is incorporated herein by reference in its entirety.

TECHNICAL FIELD

Embodiments of the invention generally relate to the placing into operation and the testing of parts. In particular, they relate to a contacting of parts with a short contact distance (fine-pitch parts), contacts for contacting parts, and a method for placing into operation and for testing a part. In particular, they relate to a contact element, a contact unit, a method for producing a contact unit, and a method for placing into operation of a part.

BACKGROUND

Electronic parts, such as for example diodes, are tested during production or subsequently to production or must be characterized. Automatic test equipment (ATE) can be used, for example, for subjecting electronic parts to marginal tests, parameter tests, or a function test. Here, the ATE must have a contacting device adjusted to the device under test (DUT).

Due to the increasing miniaturization the contacting distance of parts, for example fine-pitch diodes, i.e. diodes with a reduced distance of the contact areas for contacting, are selected increasingly shorter.

The requirements set for test and characterization methods increase production costs. Therefore, quick, cost-effective, and robust testing devices are desired.

SUMMARY

According to a first embodiment a contact element is provided. The contact element for producing an electric contact has a laser-cut conducting plate, with the contour of the laser-cut conducting plates including at least two tips, which are embodied as contacting tips for a contact pad of a part, and which are connected to each other by a separating area such that a one-piece semi-finished part is formed.

BRIEF DESCRIPTION OF THE DRAWINGS

In the following, embodiments are described using the exemplary embodiments shown in the attached figures. However, the invention is not limited to the concretely described embodiments, but may be modified and amended in a suitable manner. The scope of the invention includes combining individual features and feature combinations of an embodiment with features and feature combinations of another embodiment.

DETAILED DESCRIPTION

Figure 1:
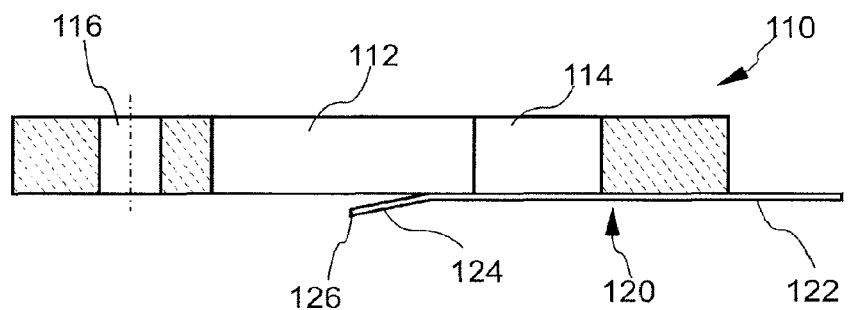
FIG. 1 shows a schematic view of a contact holder and a contact element mounted thereto, which form a contact unit according to the embodiment described here.

According to another embodiment a contact unit for producing an electric contact is provided. The contact unit including a contact element with a contour having at least two tips, which are embodied as contact tips for a contact pad of a part, includes an insulating contact holder, which is connected to the contact element, with the contact element including at least a separating area, which is provided via laser cutting, and with at least two tips being electrically isolated from each other by the separation area.

According to another exemplary embodiment a method is provided for producing a contact unit. The method comprises: cutting a one-piece conducting plate, with the contour of the conducting plate having at least two tips embodied as contact tips for a contact pad of a part, connecting the conducting plate to a holder, bending an area of the conducting plate adjacent to the two tips, and laser cutting the conducting plate at least at a separating area, with the tips being electrically insulated, with the laser cutting of the conducting plate being performed at least at a separation area after the connection.

According to another embodiment a method for placing into operation of a part is provided. The method comprises: cutting a one-piece conducting plate, with the contour of the conducting plate including at least two tips, which are embodied as contact tips for a contact pad of a part, connecting the conducting plate with a holder, bending an area of the conducting plate adjacent to at least two tips, laser cutting of the conducting plate at least at a separating area, with the tips being electrically insulated, with laser cutting the conducting plate being performed at least at a separating area after the connection was made, contacting a part, and placing into operation of said part.

In the following the invention is explained using exemplarily embodiments.

In order to simplify the understanding of the description in the following identical reference characters refer to identical elements, which are used commonly in the figures. It is provided that elements used in one embodiment may also be used in another embodiment without each being individually mentioned.

FIG. 1 shows a schematic side view of a contact unit for contacting parts, such as e.g., a fine-pitch diode. The contact unit comprises a contact holder 110 and a contact element 120. The contact holder 110 has a first window 112 according to one embodiment, which is suitable to detect the image of the contact element 120 from above or to view it. Furthermore, there is a window 114, which allows access to a part of the contact element 120 from the top for processing. In the following this window is called processing window 114. According to another embodiment the contact holder comprises for example a bore 116, in order to mount the contact holder to components of test equipment protruding therefrom or another ATE.

The contact element 120 in FIG. 1 comprises a contacting area 122 which protrudes from the contact holder 110 (in FIG. 1 on the right side) and further a bent part 124, which ends in a tip 126, which is adjusted to create a contact to the contact pad of a fine-pitch diode.

Figures 2, 3:
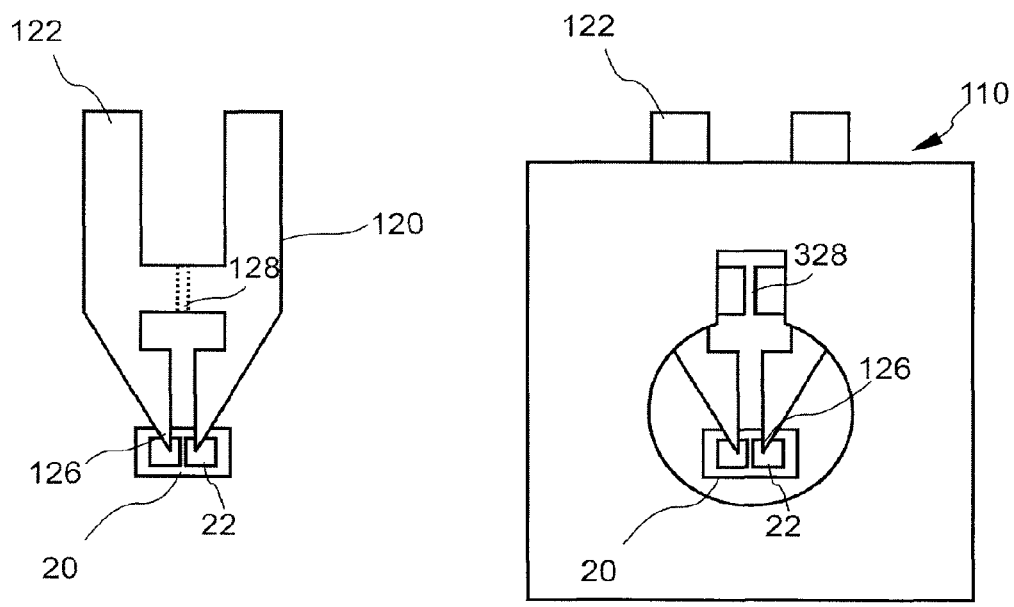
FIG. 2 shows a schematic top view of a contact element contacting a fine-pitch part according to the embodiment described here.
FIG. 3 shows a schematic top view of a contact holder and a contact element forming a contact unit, contacting a fine-pitch part according to the embodiment described here.

According to an embodiment a tip may be adjusted to contact an area ranging from e.g. 0.1 to 0.4 μm. Here, the longitudinal dimension may relate to the lateral length of a rectangular contact pad, a diameter of a circular contact pad, or the like. According to other embodiments a typical distance between adjacent contact pads may range from 0.1 .mu.m to 0.6 .mu.m. This is discernible in FIG. 2, for example. In FIG. 2 two tips 126 each contact the contact pads 22 of the part 20.

In the schematic side view shown in FIG. 1 the thickness of the contact element 120 is discernible. The contact element comprises a conducting plate, such as sheet metal, for example. It may have a thickness ranging from 0.5 mm to 2 mm.

According to an embodiment the contact element 120 in FIG. 2 is embodied in one piece and has a separating area 128, which can electrically isolate the two tips 126 from each other. This way it is possible to provide cost-effective and production ready contacts. According to an embodiment, these contact may be provided for a HF-measurement, with e.g. two contact pads of a part are each contacted by a tip 126.

As shown in FIGS. 1-3, a contact element 120 is provided. A contact element may have several areas, each of which being determined by a tip and a contacting area, and which are electrically separated from each other for a test. According to different embodiments a contact element may have two, four, or more areas. Prior to the connection to the holder the areas are connected to each other by separating areas 128, so that the semi-finished part is embodied in one piece.

Typically a contact element is produced from sheet metal by way of laser cutting. In order to structure the sheet metals quickly and precisely they can be processed via laser micro-removal. For this purpose, a micro structuring device may be used having a frequency-doubling (532 nm) or a frequency tripling (355 nm) Nd:YAG laser or a Nd:YAG laser having an original wavelength of 1064 nm. Even individual lines of an argon ion laser or a diode laser may be used for laser cutting and/or the material removal. Via a scanner system the individual positions may be approached for processing by a laser beam. According to other embodiments the use of pulsed laser radiation is possible in order to optimize the removal behavior.

Using this method very fine structures (approx. 50 μm) can be realized with high aspect ratios and angles of edge ranging from 5 to 7°.

For further optimization a laser device with VUV laser beams may be used for the production by way of precision removal. A fluorine laser has a wave-length of $\lambda=157$ nm, e.g. Using this wavelength a controlled depth removal ranging from 100 nm resolution and the processing of material is possible.

The laser cut one-piece contact element 120, as shown in FIG. 2, can be provided cost-effectively and is subsequently connected to a contact holder 110. After the contact element 120 has been connected to the contact holder 110 the contact element 120 can be electrically separated from each other by laser cutting in the separation area 128. The processing window 114 in the contact holder 110 can serve for this purpose, for example.

Based on this processing method of the contact element it is possible to mount the contacts on a contact holder in one piece and thus to maintain a position of the contact tips 126 in reference to each other until the contact element 120 is mounted to the contact holder 110.

According to another embodiment it is also possible for the contact holder 110 to be laser cut and thus also provided cost-effectively, quickly, and individually.

The contact holder 110, as described in FIGS. 1-3, is produced from an insulating material so that the contact tips 126 are electrically isolated from each other and the contact areas 122 are each provided individually for a contact element tip 136.

According to other embodiments the contact element 120 can be glued to the contact holder 110, or it can be connected thereto by other means of connection, such as screws or welding, e.g., laser welding.

Typically, it is possible according to various embodiments for the contact element 120 to comprise sheet metal, allowing a large variety of materials selected. Spring steel or copper beryllium can be used, e.g. Examples for typical thicknesses that can be used for the embodiments, as described here, range from 0.5 to 2 mm.

As discernible from FIG. 1-3, the area 124, in which bending occurred, is pressed onto the contact pads of the part. For this purpose, an elastic feature of the bent area 124 may be advantageous.

As shown in FIG. 3, the part 20 contacts with the tips 126 the contact unit comprising a contact holder 110 and a contact element 120. In FIG. 3 the separation area 328 (see area 128 in FIG. 2) has been separated by laser cutting and/or laser ablation after the contact holder 110 has been connected to the contact element 120. Hereby and due to the insulating features of the contact hole 110 the contact tips 126, each being arranged on a contact pad 22 for producing a contact are electrically isolated from each other. Using the contact unit, which now comprises individual contact tips and contact areas 122 for addressing and/or receiving measurement signals, a test or a characterization of a part can be performed.

Figure 4:
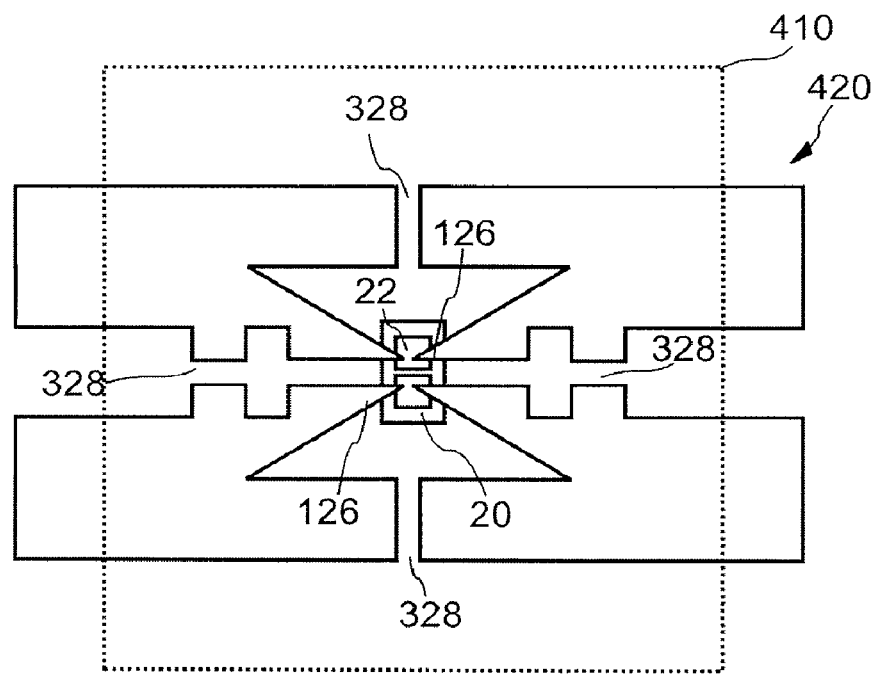
FIG. 4 shows a schematic top view of another contact unit contacting a fine-pitch parts according to an embodiment described here.

FIG. 4 shows another embodiment of a contact element 420. The contact element 420 comprises four areas, which have been separated from each other by separation areas 328 by laser cutting. Therefore the four contact tips 126 are electrically separated from each other. The four tips 126 form a Kelvin-test contact for characterizing or testing the part 20 using the contact pads 22. The contact holder 410 shown in FIG. 5 has been connected to the contact element 420, so that the tips 126 are in a fixed position in reference to each other before an electric separation of the tips 126 in the separation areas 328 is performed. In FIG. 4 this is indicated by the contact holder 410 in dot-dash lines.

Typically it is possible according to various embodiments that the contact element 120 comprises sheet metal allowing a large variety of materials selected. For example, spring steel or copper beryllium may be used.

In order to structure sheet metal quickly and precisely it may be processed via laser micro-removal. For this purpose, a micro structuring device with a frequency doubled (532 nm) or frequency tripled (355 nm) Nd:YAG laser or a Nd:YAG laser can be used with its original wavelength amounting to 1064 nm. Individual lines of an argon-ion laser or a diode laser can also be used for the laser cutting and the material removal. Via a scanner system the individual positions can be approached for processing by a laser beam. According to another embodiment the use of pulsed laser beams is possible in order to optimize the removal behavior.

Using this process very fine structures (approx. 50 .mu.m) can be realized with high aspect ratios and angles of edges ranging from 5 to 7°. Additional options for laser cutting contact element, a contact holder, or a separation area can be performed similarly to the one described in the embodiment.

Even in a Kelvin-test contact, typically the following dimensions are provided for the contact pads and thus for the distance of the contact tips 126.

According to a first exemplary embodiment a tip can be paired, contacting an area ranging from 0.1 to 0.4 μm, for example. Here the length may relate, for example, to the lateral length of a rectangular contact pad, a diameter of a circular contact pad, or the like. According to other embodiments a typical distance between adjacent contact pads of a part may range from 0.1 μm to 0.6 μm.

Figure 5:
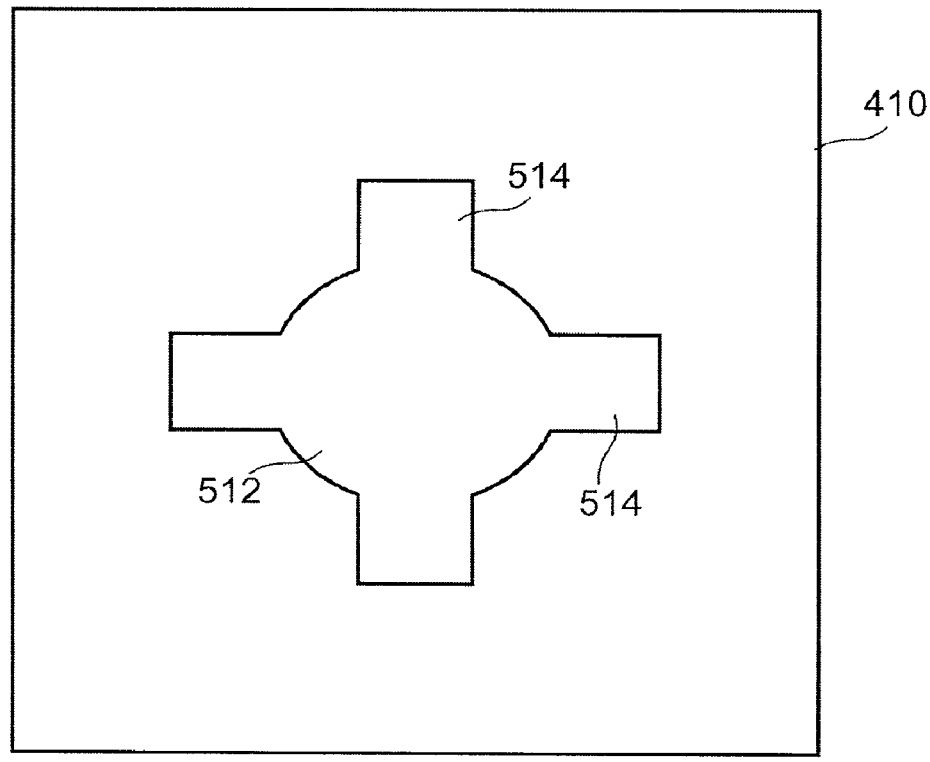
FIG. 5 shows a schematic view of another contact holder according to embodiments described here.

When separating a test contact 420, such as for example a Kelvin-test contact, for measuring four tips 126, a test contact is separated into four areas, this is indicated in FIG. 5 by the four processing windows 514. As shown in FIG. 5, the window 512 to be considered similar to the window 112 in FIG. 1, serves for example to align a contact unit to a part in an placing into operation process. A visual alignment of the contact unit in reference to the part can be performed through the window 512.

Figure 6:
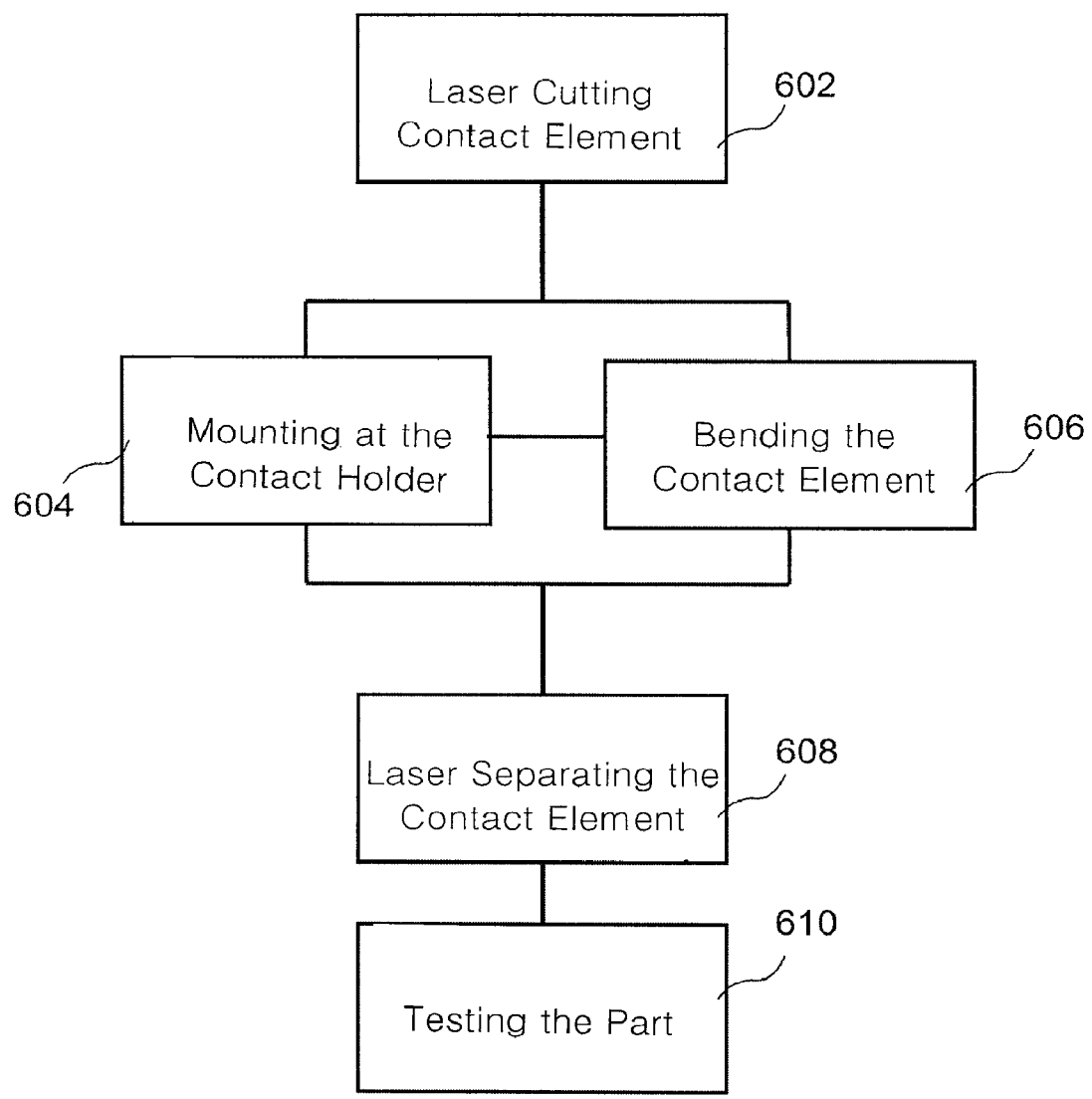
FIG. 6 shows a flow chart for illustrating methods to contact fine-pitch parts according to the embodiments described here.

FIG. 6 shows a method illustrating embodiments for performing the placing into operation or the testing of a part. In step 602 a one-piece contact element is provided by laser cutting. The one-piece contact element is mounted to the contact holder in step 604. According to another embodiment the contact holder can also be produced by laser cutting. Typical embodiments for mounting the contact element to a contact holder include gluing, screwing, or welding, e.g., laser welding. In step 606 the areas of the contact element in FIG. 1, marked with the reference character 124, are bent such that subsequently they can be pressed onto a contact pad.

In FIG. 6 the mounting of a contact element to a contact holder and the bending of the contact element and/or the contacting tips is shown parallel to each other. This serves to illustrate different embodiments, because bending the contact element can be performed prior to the mounting at a contact holder or after the mounting at the contact holder.

After the contact element has been mounted to the contact holder the individual areas of the contact element are separated from each other by laser cutting in step 608. Hereby the contact tips are electrically separated from each other by the respectively allocated contacting areas 122 for the respective contact element tip. Using the contact unit, which now comprises individual contact tips for addressing and/or receiving measurement signals, an placing into operation, a test, or a characterization can be performed in step 610.

Figure 7:
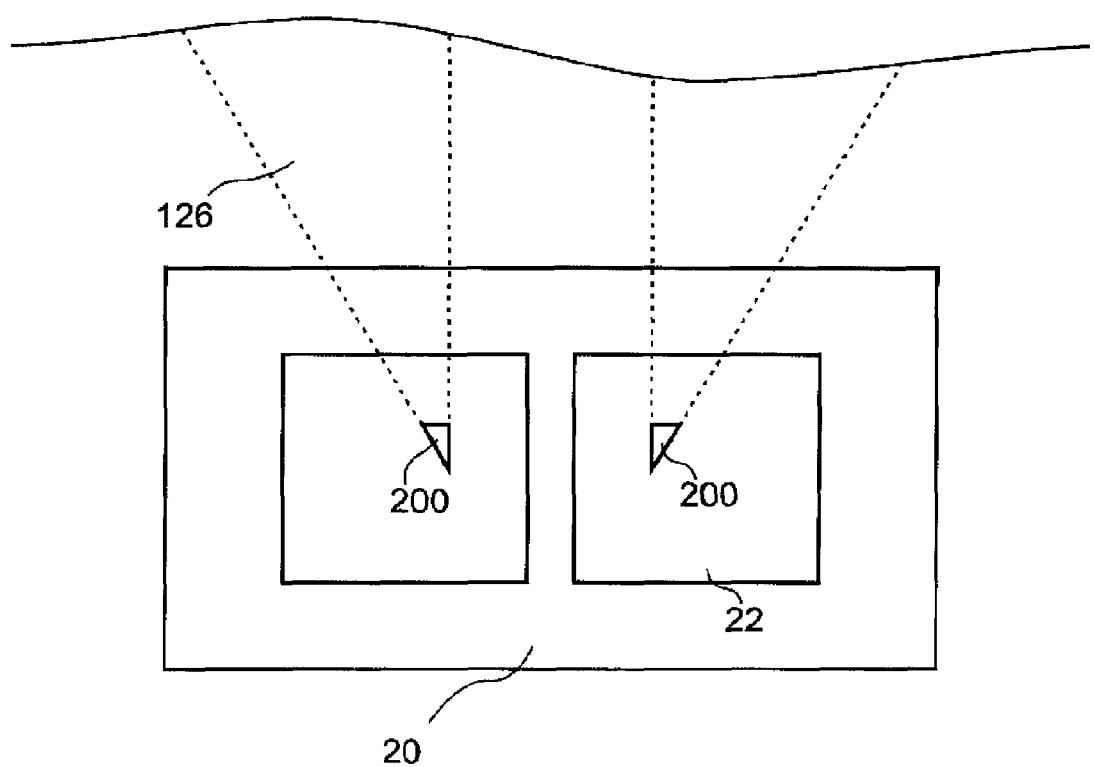
FIG. 7 shows an example of contact impressions on a part left by contact tips.

Exemplary embodiments also relate to parts tested with the described contact elements, contact units, and with the methods for testing parts. Here, these parts may also be identified by the impressions in the contact pads 22 of the part 20 left by the contact tips 126, such as impressions 200 shown in FIG. 7.

While the above-described statements relate to embodiments other embodiments may be deducted therefrom without leaving the scope of the invention determined by the claims.

LIST OF REFERENCE CHARACTERS

Contact Elements for Fine-Pitch Parts
110 contact holder
112 window
114 processing window
116 bore
120 contact element
122 contact area 124 bent part
126 tip
128 separating area
20 part
22 contacting pad
328 separating area
410 contact holder
420 contact element
512 window
514 processing window
602 laser cutting contact element
604 mounting contact element-contact holder
606 bending contact element
608 laser separating
610 testing

What is claimed is:

1. A method for placing into operation of a part comprising:
cutting a one-piece conducting plate, wherein the contour of the conducting plate includes at least two tips embodied as contact tips for a contact pad of a part;
connecting the conducting plate to a holder;
bending a conducting plate in an area adjacent to the at least two tips;
laser cutting the conducting plate at least at a separating area, with the tips being insulated electrically, wherein the laser cutting of the conducting plate at least in the separating area is performed after the connection of the conducting plate to the holder has been performed;
contacting a part; and
placing into operation of said part, wherein the placing into operation is testing.

2. The method of claim 1, wherein the cutting of the one-piece conducting plate is performed via laser beams.

3. The method of claim 1, further comprising:
laser cutting the holder.

4. The method of claim 1, wherein the conducting plate includes sheet metal.

5. The method of claim 1, wherein the contour of the conducting plate includes at least two contacting areas, and with one contacting area each corresponding to one of the tips.

6. The method of claim 1, wherein the one-piece conducting plate is formed from a one-piece semi-finished part.

7. The method 1, further comprising gluing together the one-piece conducting plate and the holder.

8. The method of claim 1, wherein the laser cutting of the conducting plate at the separation area is performed through a processing window in the holder.

* * * * *